(12) United States Patent
Maynard et al.

(10) Patent No.: US 8,877,654 B2
(45) Date of Patent: Nov. 4, 2014

(54) PULSED PLASMA TO AFFECT CONFORMAL PROCESSING

(75) Inventors: Helen Maynard, North Reading, MA (US); Vikram Singh, North Andover, MA (US); Svetlana Radovanov, Marblehead, MA (US); Harold Persing, Westbrook, ME (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 837 days.

(21) Appl. No.: 12/760,847

(22) Filed: Apr. 15, 2010

(65) Prior Publication Data

US 2011/0256732 A1 Oct. 20, 2011

(51) Int. Cl.
*H01L 21/31* (2006.01)

(52) U.S. Cl.
USPC ............... 438/766; 427/523; 257/E21.211

(58) Field of Classification Search
CPC ............................. H01L 21/30; C23C 14/48
USPC ............... 438/766; 427/523; 257/E21.211
See application file for complete search history.

(56) References Cited

U.S. PATENT DOCUMENTS

| | | | |
|---|---|---|---|
| 6,875,700 B2 | 4/2005 | Kanakasabapathy et al. | |
| 2007/0069157 A1 | 3/2007 | Mehta et al. | |
| 2008/0075880 A1 * | 3/2008 | Renau et al. | 427/523 |
| 2008/0081483 A1 * | 4/2008 | Wu | 438/714 |
| 2008/0132046 A1 * | 6/2008 | Walther | 438/513 |
| 2008/0179546 A1 * | 7/2008 | Lee et al. | 250/492.21 |
| 2008/0242065 A1 * | 10/2008 | Brcka | 438/513 |
| 2008/0317968 A1 * | 12/2008 | Singh et al. | 427/523 |
| 2009/0001890 A1 | 1/2009 | Singh et al. | |
| 2009/0061605 A1 * | 3/2009 | Godet et al. | 438/511 |
| 2009/0084987 A1 * | 4/2009 | Godet et al. | 250/492.3 |
| 2010/0080928 A1 * | 4/2010 | Mullapudi et al. | 427/523 |

OTHER PUBLICATIONS

Subramonium, Pramod, et al., Extraction of Negative Ions from Pulsed Electronegative Inductively Coupled Plasmas Having a Radio-Frequency Substrate Bias, Journal of Vacuum Science and Technology: Part A, May 1, 2004, pp. 534-544, vol. 22, No. 3, AVS/AIP, Melville, New York, U.S.

Badri Ramamurthi & Demetre J. Economou, Two-Dimensional Pulsed-Plasma Simulation of a Chlorine Discharge, J. Vac. Sci. Tech. A, Mar./Apr. 2002, pp. 467-478, 20(2).

* cited by examiner

*Primary Examiner* — Kim Nguyen
*Assistant Examiner* — Caleb Henry

(57) ABSTRACT

A plasma processing method is provided. The plasma processing method includes using the after-glow of a pulsed power plasma to perform conformal processing. During the afterglow, the equipotential field lines follow the contour of the workpiece surface, allowing ions to be introduced in a variety of incident angles, especially to non-planar surfaces. In another aspect of the disclosure, the platen may be biased positively during the plasma afterglow to attract negative ions toward the workpiece. Various conformal processing steps, such as implantation, etching and deposition may be performed.

12 Claims, 6 Drawing Sheets

PULSED PLASMA TO AFFECT CONFORMAL PROCESSING

BACKGROUND

A plasma processing apparatus generates a plasma in a process chamber for treating a workpiece supported by a platen in the process chamber. A plasma processing apparatus may include, but not be limited to, doping systems, etching systems, and deposition systems. The plasma is generally a quasi-neutral collection of ions (usually having a positive charge) and electrons (having a negative charge). The plasma has an electric field of about 0 volts per centimeter in the bulk of the plasma. In some plasma processing apparatus, ions from the plasma are attracted towards a workpiece. In a plasma doping apparatus, ions may be attracted with sufficient energy to be implanted into the physical structure of the workpiece, e.g., a semiconductor substrate in one instance.

Turning to FIG. 1, a block diagram of one exemplary plasma doping apparatus 100 is illustrated. The plasma doping apparatus 100 includes a process chamber 102 defining an enclosed volume 103. A gas source 104 provides a primary dopant gas to the enclosed volume 103 of the process chamber 102 through the mass flow controller 106. A gas baffle 170 may be positioned in the process chamber 102 to deflect the flow of gas from the gas source 104. A pressure gauge 108 measures the pressure inside the process chamber 102. A vacuum pump 112 evacuates exhausts from the process chamber 102 through an exhaust port 110. An exhaust valve 114 controls the exhaust conductance through the exhaust port 110.

The plasma doping apparatus 100 may further includes a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma doping apparatus further includes a source 101 configured to generate a plasma 140 within the process chamber 102. The source 101 may include a RF source 150 such as a power supply to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 350 to the RF antennas 126, 146.

The plasma doping apparatus may also include a bias power supply 190 electrically coupled to the platen 134. The plasma doping system may further include a controller 156 and a user interface system 158. The controller 156 can be or include a general-purpose computer or network of general-purpose computers that may be programmed to perform desired input/output functions. The controller 156 may also include communication devices, data storage devices, and software. The user interface system 158 may include devices such as touch screens, keyboards, user pointing devices, displays, printers, etc. to allow a user to input commands and/or data and/or to monitor the plasma doping apparatus via the controller 156. A shield ring 194 may be disposed around the platen 134 to improve the uniformity of implanted ion distribution near the edge of the workpiece 138. One or more Faraday sensors such as Faraday cup 199 may also be positioned in the shield ring 194 to sense ion beam current.

In operation, the gas source 104 supplies a primary dopant gas containing a desired dopant for implantation into the workpiece 138. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 190 provides a pulsed platen signal having a pulse ON and OFF periods to bias the platen 134 and hence the workpiece 138 to accelerate ions 109 from the plasma 140 towards the workpiece 138. The ions 109 may be positively charged ions and hence the pulse ON periods of the pulsed platen signal may be negative voltage pulses with respect to the process chamber 102 to attract the positively charged ions. The frequency of the pulsed platen signal and/or the duty cycle of the pulses may be selected to provide a desired dose rate. The amplitude of the pulsed platen signal may be selected to provide a desired energy.

A drawback with conventional plasma processing is the lack of angular spread control of the ions 109. As structures on the workpiece become smaller and as three dimensional structures on the surface of the workpiece become more common (e.g., trench capacitors, vertical channel transistors such as FinFETs), it would be beneficial to have greater angle control. For example, FIG. 2 shows a FinFET 200 having an exaggerated size for clarity of illustration. Regions 201 are active regions, which must be implanted with ions. Using conventional plasma processing systems, it is difficult to implant ions in surfaces that are not parallel to the platen and workpiece surface. One possible approach to overcoming this is by tilting the platen. However, if the FinFET (or other feature) has a high aspect ratio (defined as the ratio of its height to its width), the maximum tilt angle is limited. For example, FIG. 2B shows a set of features 200, each having a height h and spaced apart by a width w. In order for ions to reach the lowest corner 211 of the feature, the platen must have a tilt angle ($\theta_c$) no greater than that given by the equation, $$\tan^{-1}(\theta_c) = \frac{w}{h},$$

where w is the width between features and h is the height of the feature. Thus, as the aspect ratio increases, the maximum tilt angle decreases, making it difficult to implant an adequate amount of ions in the regions 201.

In typical plasmas, sheaths form at the plasma boundaries. These plasmas typically comprise positive ions and free electrons. These two charged species have vastly different masses. Referring to FIG. 3, the presence of this sheath causes equipotential field lines 300 to be parallel to the workpiece surface 310. The formation and shape of the plasma causes the plasma to be at a voltage $V_p$ within the sheath. This voltage is typically positive, as the electrons are separated from the positive ions. The platen, and therefore the workpiece surface 310 are held at a different voltage, such as $V_{cathode}$. To transition between these two voltages, a potential gradient exists. Due to the relative shape of the plasma and workpiece surface, this gradient can be represented by parallel equipotential lines 300. It is known that ions 109 tend to travel in paths that are perpendicular to the equipotential field lines as they are accelerated toward to the platen and workpiece surface. Thus, in this case, the positive ions 109 strike the workpiece surface orthogonally. While this is acceptable for traditional workpiece processing, it is ineffective in processing three-dimensional features, such as FinFETs. Thus, existing techniques may be inadequate for conformal processing.

Accordingly, there is a need for a plasma processing method that overcomes the above-described inadequacies and shortcomings.

SUMMARY

According to a first aspect of the disclosure, a plasma processing method is provided. The plasma processing method includes using the after-glow of a pulsed power plasma to perform conformal processing. During the afterglow, the equipotential field lines follow the contour of the non-planar workpiece surface, allowing ions to be introduced in a variety of incident angles, especially to non-planar surfaces. In another aspect of the disclosure, the platen may be biased positively during the plasma afterglow to attract negative ions toward the workpiece.

BRIEF DESCRIPTION OF THE DRAWINGS

For a better understanding of the present disclosure, reference is made to the accompanying drawings, in which like elements are referenced with like numerals, and in which.

DETAILED DESCRIPTION

As described above, traditional plasma processing apparatus generate positive ions that are accelerated toward the workpiece at an angle orthogonal to the plane of the platen. Since three-dimensional features may have surfaces that are not parallel to the platen surface, traditional plasma processing methods is ineffective at processing these new features. Conformal processing requires the ability to process all surfaces equally, regardless of orientation.

Figure 1:
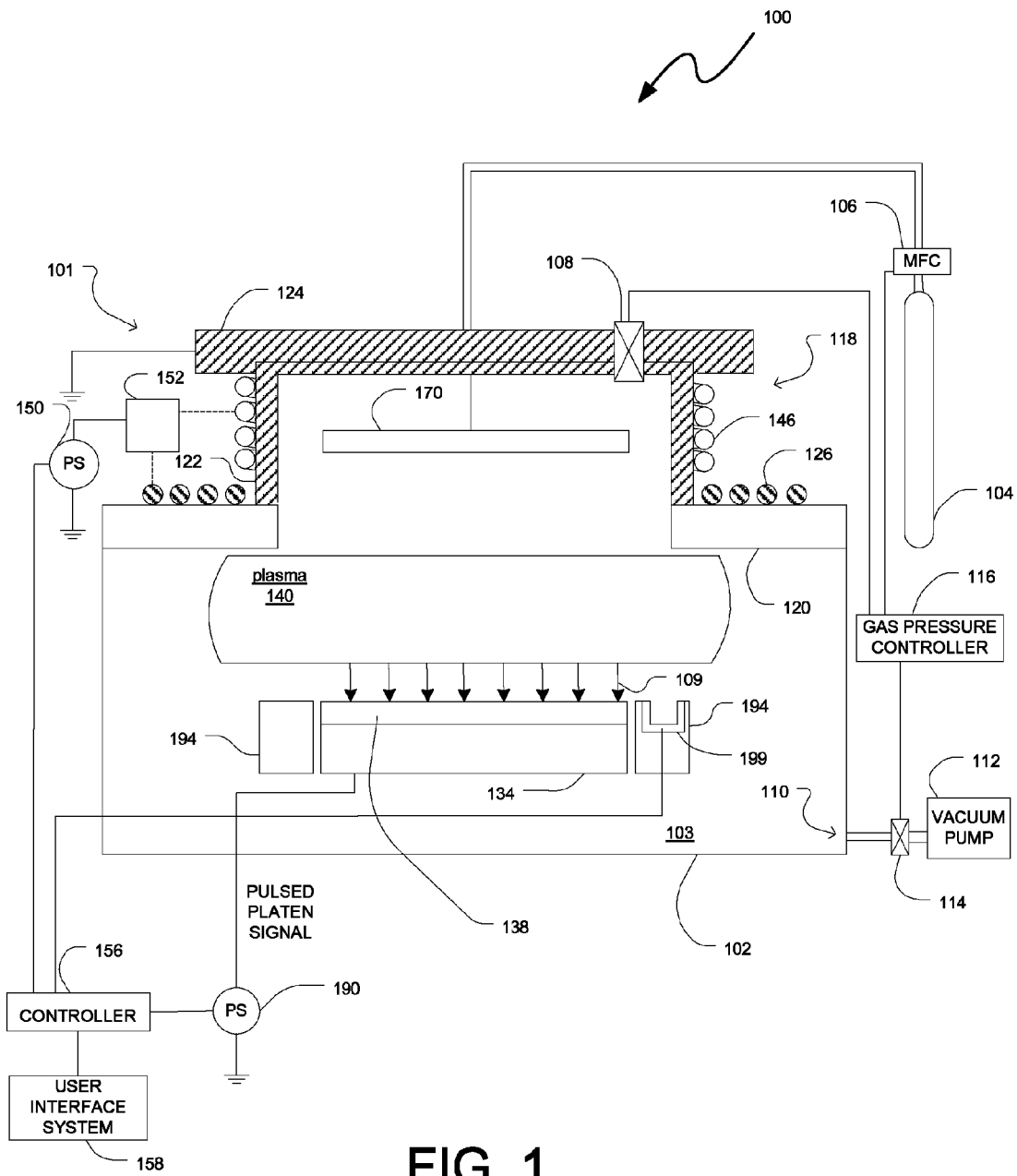
FIG. 1 is a block diagram of a plasma doping apparatus consistent with the disclosure.

Referring to FIG. 1, when the power supply 150 is active, it creates a plasma 140 in the plasma processing apparatus 100. When the plasma source power 150 is inactive, the plasma dissipates. When the power is removed, the electrons, which are the lightest species, exit the plasma first. The most energetic electrons reach the walls of the process chamber 102 first, leaving lower energy electrons behind.

Figure 4:
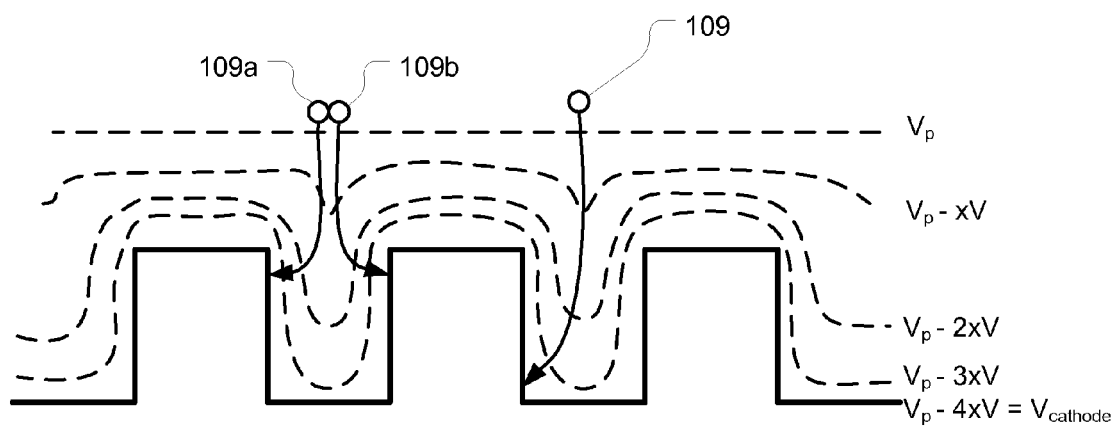
FIG. 4 is a cross sectional view of the equipotential lines of a plasma processing apparatus consistent for the disclosure.

If the components of the plasma include electronegative molecules, these low energy electrons may attach to neutral molecules or radicals to form negative ions. If the components of the plasma are sufficiently electronegative, the number of negative ions created may approach the number of positive ions, thereby creating an ion-ion plasma. In contrast to conventional plasma, in an ion-ion plasma, the outer sheath collapses, since the charged species have nearly the same mass. Because of the absence of an electron sheath, in an ion-ion plasma, the equipotential field lines follow the contour of the workpiece, as shown in FIG. 4. As before, the ions 109 tend to move in paths that are perpendicular to the equipotential field lines. However, since these lines now follow the contour of the non-planar workpiece surface, the ions 109 strike the workpiece at a plurality of incident angles, as shown in FIG. 4.

As described above, compounds with high electronegativity are particularly well suited to this application. Halogenated gasses, such as those containing fluorine, bromine, chlorine, and iodine, are especially electronegative. However, other molecules are also within the scope of the disclosure.

Figure 5A:
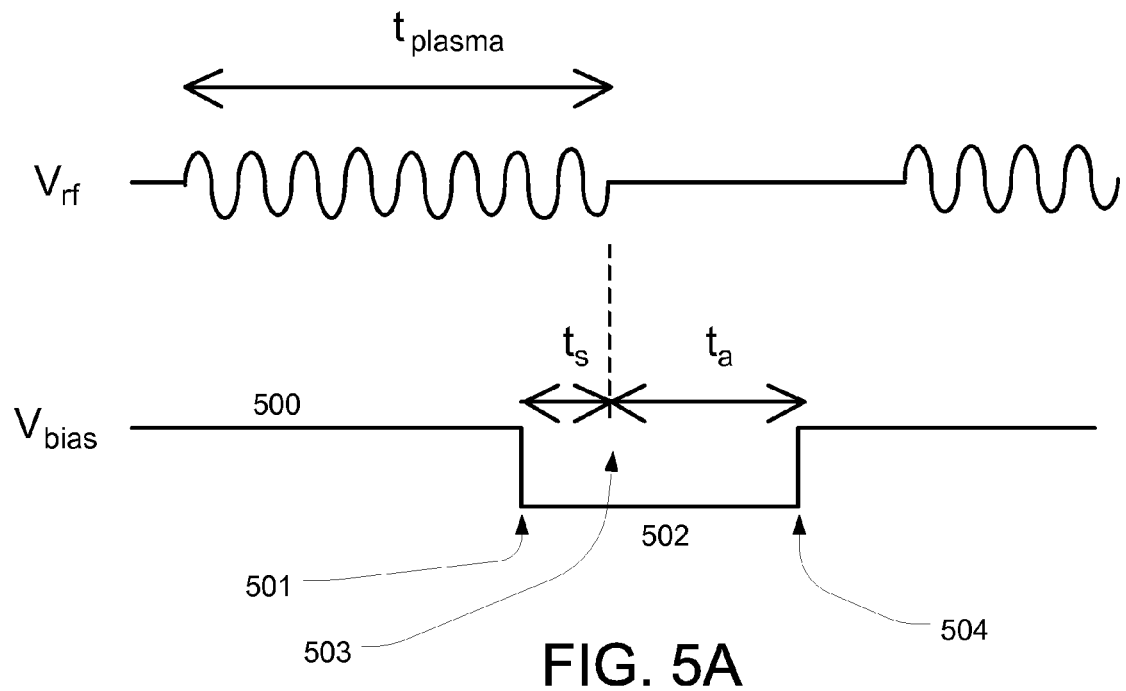
FIG. 5A is a timing diagram according to one embodiment of the disclosure.

Referring to FIG. 5A, a timing diagram is shown that may be used in accordance with one embodiment of the present disclosure. $V_{rf}$ represents the voltage applied by power supply 150 (see FIG. 1) to the planar antenna 126 and helical antenna 146. $T_{plasma}$ represents the duration during which the antennae 126, 146 are being energized, so as to create a plasma 140 as described in reference to FIG. 1. $V_{bias}$ represents the voltage applied by power supply 190 (see FIG. 1) to the platen 134. In this embodiment, prior to time 501, the platen 134 is held at a voltage 500, which does not attract ions toward it. At a later point in time, for example, at time 501, the platen 134 is biased negatively so as to draw positively charged ions from the plasma 140 toward it. This step lasts for a duration represented by $t_s$. This portion of the process is similar to that conventionally used. While the platen is still negatively biased to voltage 502, the power supply 150 is disabled at time 503, thereby dissipating the plasma 140 and causing the elimination of the sheath. During the remainder of the bias voltage pulse (from time 503 to time 504 or $t_a$), the positive ions that are attracted toward the platen 134 move across equipotential field lines, like those shown in FIG. 4. Thus, during time period $t_s$, the positive ions strike the workpiece 138 at an incident angle that is perpendicular to the platen 134. Subsequently, during time period $t_a$, the positive ions strike the workpiece 138 at a wider range of incident angles, thereby being better suited to three dimensional features, such as FinFETs. The term $t_s$ is used to denote the time period during which the plasma sheath exists, while the term $t_a$ is used to denote the time period during which the plasma afterglow is used. The time periods, $t_a$ and $t_s$, can be of any desired time period and their durations can be independently controlled. The ratio of $$\frac{t_s}{t_a}$$

represents the amount of time that the ions are orthogonally accelerated toward the platen 134 as compared to the amount of time that the ions are accelerated across contoured field lines. Varying the relative values of these time periods can change the amount of processing that occurs on the sidewalls of three dimensional features. In addition, the duration of the plasma creation, $t_{plasma}$, may be varied as well to change the characteristics of the plasma.

Figure 5B:
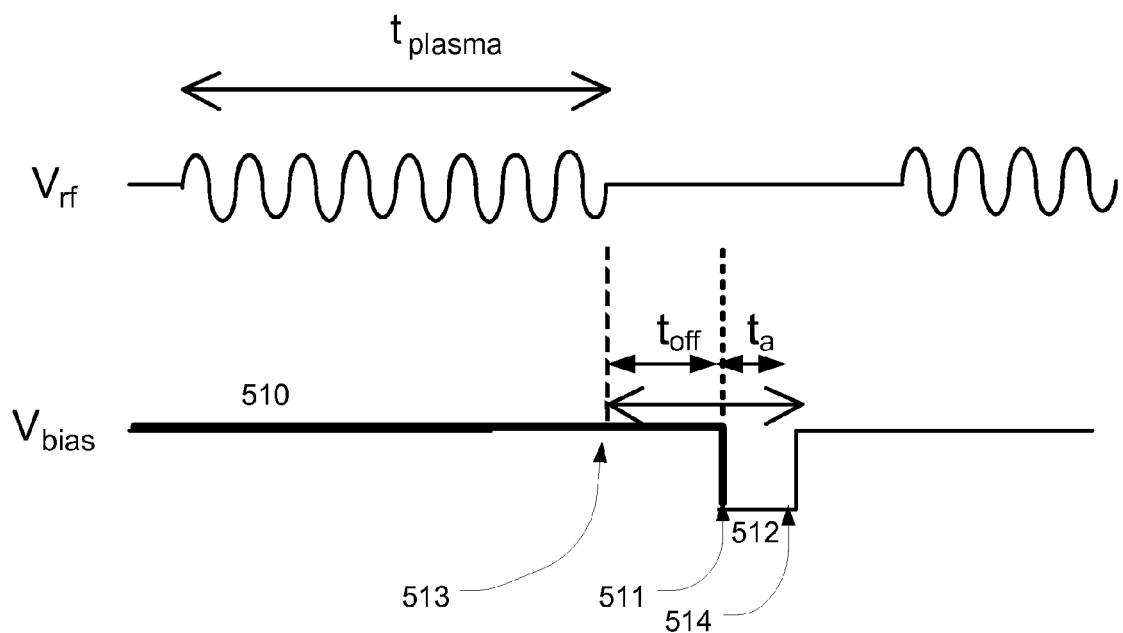
FIG. 5B is a timing diagram according to another embodiment of the disclosure.

Referring to FIG. 5B, a timing diagram is shown that may be used in accordance with another embodiment of the present disclosure. As described above, $V_{rf}$ represents the voltage applied by power supply 150 (see FIG. 1) to the antennae 126, 146. $T_{plasma}$ represents the duration during which the antennae 126, 146 are being energized, so as to create a plasma 140 as described in reference to FIG. 1. $V_{bias}$ represents the voltage applied by power supply 190 (see FIG. 1) to the platen 134. In this embodiment, prior to time 511, the platen 134 is held at a voltage 510, which does not attract ions toward it. At a later point in time, for example, at time 513, the power supply 150 is disabled, thereby dissipating the plasma 140 and causing the elimination of the sheath. At a time 511, the platen 134 is biased negatively so as to draw positively charged ions from the plasma 140 toward it. The period during which both the power supply 150 is disabled, and the bias voltage has not yet been applied is labeled $T_{off}$. This time period may vary in duration, and may be as small as 0. During the bias voltage pulse (from time 511 to time 514, or $t_a$), the positive ions that are attracted toward the platen 134 move across equipotential field lines, like those shown in FIG. 4. Thus, during time period t, the positive ions strike the workpiece 138 at a wider range of incident angles, thereby being better suited to three dimensional features, such as FinFETs. The term $t_{off}$ is used to denote the time period during which the RF power supply 150 is disabled and the bias voltage is not yet applied. The term $t_a$ is used to denote the time period during which the plasma afterglow is used. The time periods, $t_a$ and $t_{off}$, can be of any desired time period and their durations can be independently controlled. Varying the relative values of these time periods can change the amount of processing that occurs on the sidewalls of three dimensional features. In addition, the duration of the plasma creation, $t_{plasma}$, may be varied as well to change the characteristics of the plasma.

Figure 6:
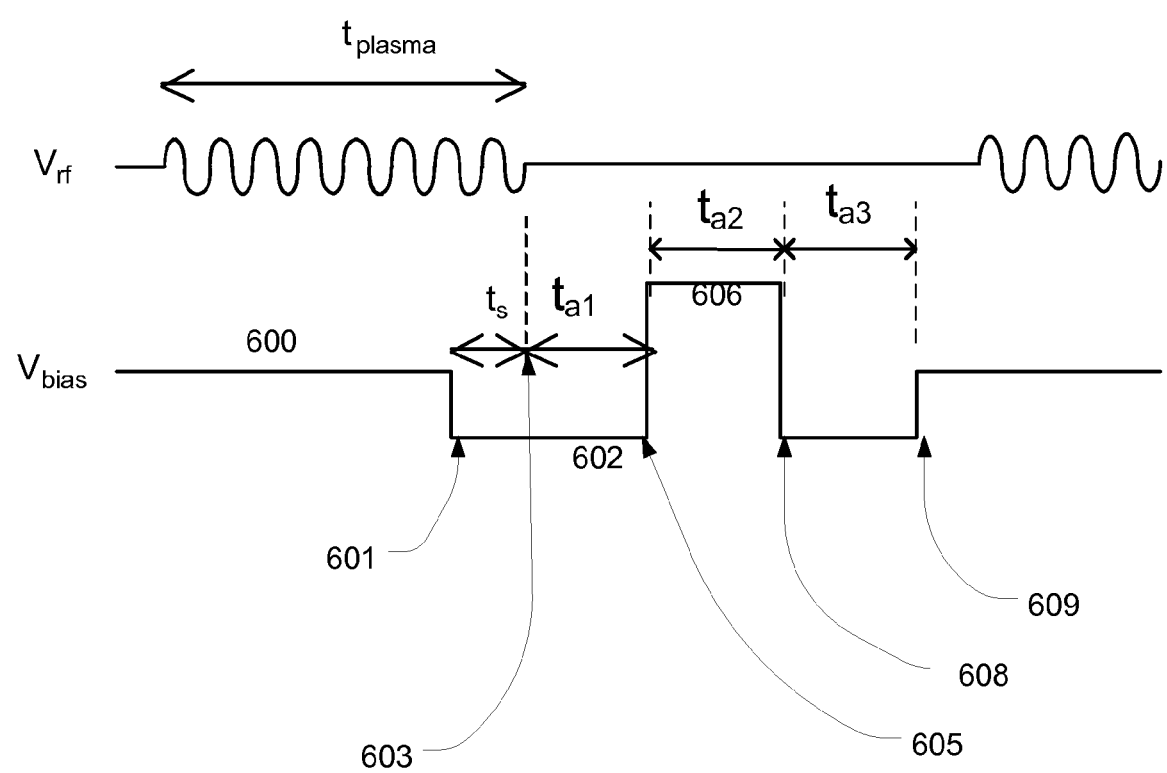
FIG. 6 is a timing diagram according to another embodiment of the disclosure.

FIG. 6 shows another embodiment of the present disclosure. As described with reference to FIGS. 5A-B, the power supply 150 is used to energize the plasma during time duration $t_{plasma}$. During at least a portion of this time, the platen 134 is held at a voltage 600 so as not to attract ions. At time 601, the power supply 190 biases the platen 134 negatively (at voltage 602) so as to attract positive ions toward the platen 134. At time 603, the power supply 150 is disabled, thereby allowing the plasma 140 to dissipate. During the time period $t_{a1}$, the equipotential lines move to the contour of the workpiece surface, allowing ions to impact the workpiece at a range of incident angles. At time 605, the power supply 190 biases the platen positively to voltage 606. Since the plasma 140 now comprises both positive and negative ions, the negative ions are attracted toward the workpiece 138, and impact the workpiece 138 at a range of incident angles while time duration $t_{a2}$. At time 608, the power supply 190 again biases the platen negatively to voltage 602, thereby attracting positive ions toward the workpiece 138 during the time duration $t_{a3}$. In other embodiments, the platen 134 may be returned to voltage 600 after time 608. In other embodiments, a subsequent positive biasing duration may be added after time duration $t_{a3}$.

In another embodiment, the bias voltage for the platen is not applied until after time 603, as shown in FIG. 5B.

The process described herein can be used for any conformal processing process, including but not limited to implantation, deposition and etching. The creation of equipotential field lines which follow the contours of the workpiece surface allow ions to be introduced to the workpiece surface at a range of incident angles. For example, ions may be introduced to a vertical feature at an incident angle that is parallel to the platen. In other words, the ions may be introduced orthogonally, even to vertical features.

In the case of ion implantation, this process can be used in the creation and processing of FinFETs, and other structures, such as MEMS structures. FIG. 4 shows ions 109a, 109b being implanted to the vertical sidewalls of the feature at an incident angle that is orthogonal to the feature. Similar results can be achieved with differently sloped features.

Figure 7:
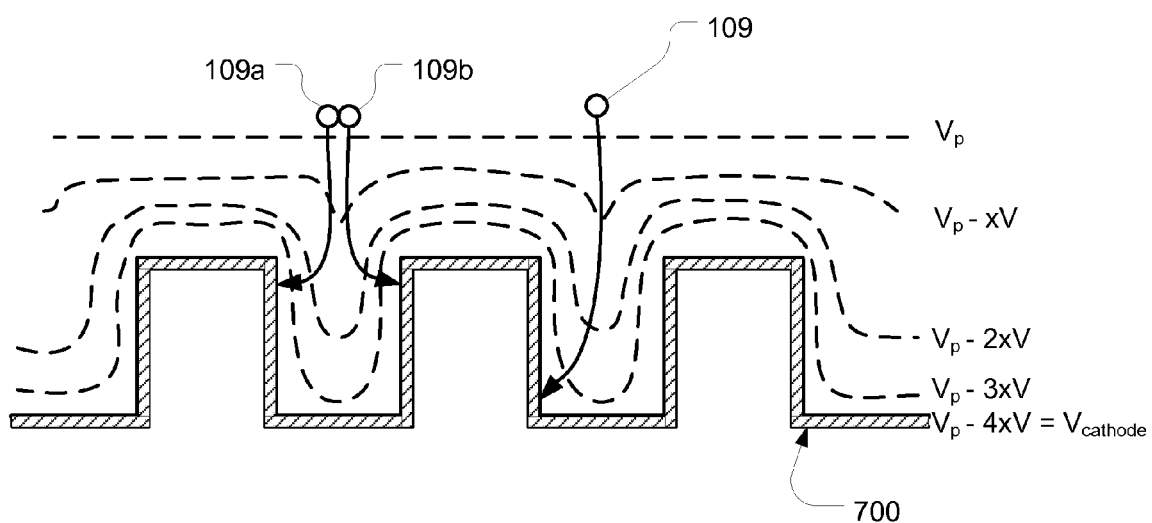
FIG. 7 is a cross sectional view of the equipotential lines of a plasma processing apparatus used for deposition.

This process also allows uniform deposition of material on a non-planar workpiece surface. In traditional deposition systems, the material is deposited in the vertical direction, thereby causing a thicker costing to be applied to horizontal surfaces as opposed to vertical surfaces. The present process can be used to provide a more consistent thickness deposition on a non-planar workpiece surface. For example, FIG. 7 shows a deposition layer 700 that is uniform on both horizontal and vertical surfaces.

Similarly, this process can be used for etching various features into the workpiece. One could choose to use an etching gas to create the plasma, such as CF4. Ions such as $CF_x^+$ would be accelerated towards the surface through the sheath. As the sheath begins to collapse, the trajectory of the ions could be bent towards the sidewalls of the structures, or even, potentially, towards the underside of a cantilevered structure, as is sometimes used in MEMS devices. Ions deliver energy to the surface disrupting the lattice organization, breaking chemical bonds, and enabling the chemical etchants (ionized or neutrals) to react with the substrate atoms/molecules, thereby etching the substrate.

Figure 2A:
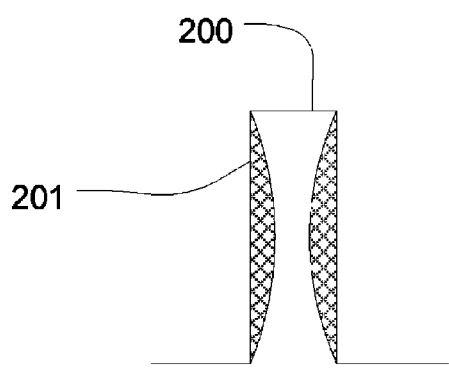
FIG. 2A is a cross sectional view of a FinFET showing active regions perpendicular to the workpiece surface.
Figure 2B:
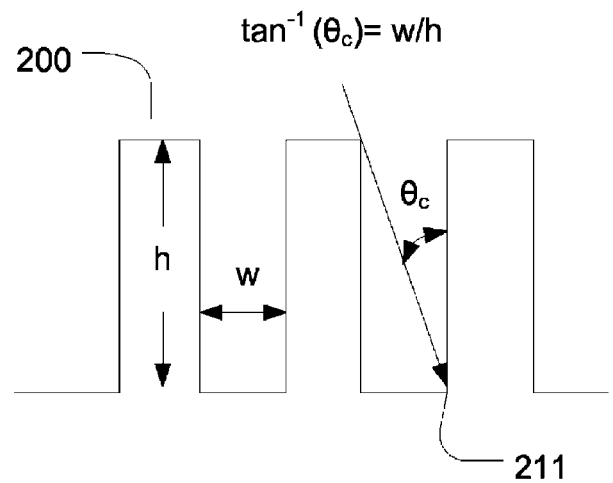
FIG. 2B is an illustration showing the maximum tilt angle that can be achieved for a feature having a particular aspect ratio.
Figure 3:
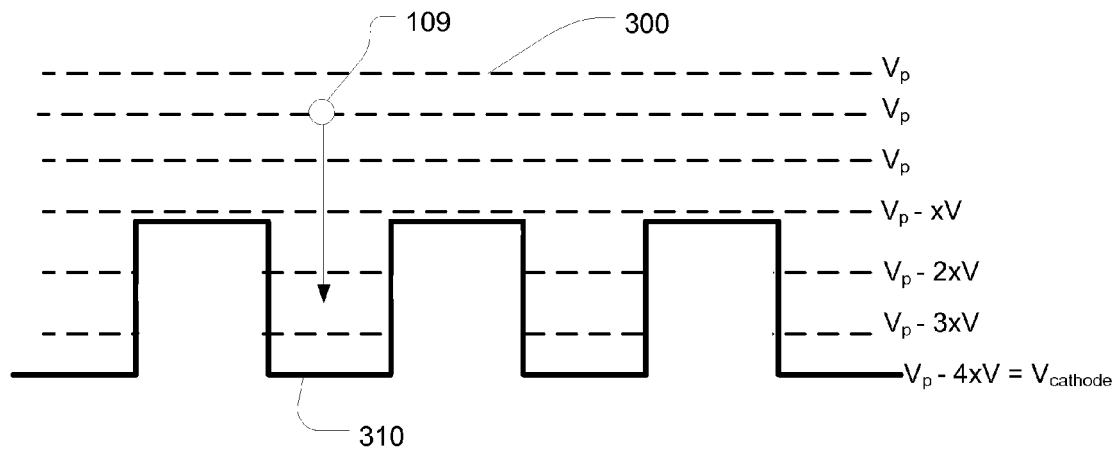
FIG. 3 is a cross sectional view of the equipotential lines of a conventional plasma processing apparatus.

As stated above, this process is advantageously used with non-planar workpiece surfaces. Workpiece surfaces can be made non-planar using a variety of techniques. For example, FinFET and other three-dimensional features can be created on the surface of a workpiece through an etching process. Referring to FIG. 2A, a photoresist mask can be applied to the surface of the workpiece, such as to the horizontal surface of FinFET 200. The workpiece is then etched using conventional means to remove material from either side of the FinFET 200. FIG. 2B shows a plurality of FinFETs that can be created using an etching process. Alternatively, other processes known to those of ordinary skill in the art can be used to create a non-planar workpiece surface.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece comprising:

creating a plasma in a chamber by activating a power supply that is electrically coupled to at least one of helical and planar antennas disposed outside the chamber;

negatively biasing a platen upon which said workpiece is positioned so as to attract ions from said plasma to said workpiece, the platen being negatively biased while the power supply is active; and disabling said power supply while maintaining said negative bias on said platen, thereby continuing to attracting ions to said workpiece, wherein the path of said attracted ions is affected by said disabling of said power source.

2. The method of claim 1, further comprising positively biasing said platen after said maintaining said negative bias on said platen and after said disabling of said power source and after said maintaining.

3. The method of claim 2, further comprising negatively biasing said platen after said platen has been positively biased.

4. The method of claim 3, wherein said negatively biasing said platen after said platen has been positively biased occurs while said power supply is disabled.

5. A method of introducing ions to a non-planar workpiece surface, comprising:
generating a plasma having a sheath in a chamber by activating a power supply that is electrically coupled to at least one of helical and planar antennas disposed outside the chamber;
disabling said power supply after said plasma has been generated so as to eliminate said sheath, thereby creating equipotential field lines which follow contours of said non-planar workpiece;
biasing said non-planar workpiece while the power supply is active and continuing to bias said non-planar workpiece while the power supply is disabled so as to attract ions previously generated in said plasma toward said non-planar workpiece, wherein path of said ions attracted toward said non-planar workpiece is determined based on said equipotential field lines.

6. The method of claim 5, wherein said path of said ions is perpendicular to said equipotential field lines.

7. The method of claim 5, wherein said ions are implanted into said non-planar workpiece.

8. The method of claim 5, wherein said ions are deposited on said non-planar workpiece.

9. The method of claim 5, wherein said ions are used to etch said non-planar workpiece.

10. The method of claim 5, wherein said non-planar workpiece comprises a non-planar feature, and wherein said feature comprises a FinFET.

11. The method of claim 5, wherein said non-planar workpiece comprises a non-planar feature, and wherein said feature comprises a MEMS structure.

12. The method of claim 5, wherein said path of said ions is perpendicular to said equipotential field lines.

* * * * *